United States Patent
Kim et al.

(10) Patent No.: US 10,836,267 B2
(45) Date of Patent: Nov. 17, 2020

(54) ELECTRIC VEHICLE AND COOLING METHOD THEREOF

(71) Applicants: Hyundai Motor Company, Seoul (KR); Kia Motors Corporation, Seoul (KR)

(72) Inventors: Kyung Su Kim, Gwangju (KR); Gun Seok Yoon, Seoul (KR); Hyeon Jun Kim, Gyeonggi-do (KR); Young Chan Byun, Seoul (KR); Gi Bum Kim, Gyeongsangbuk-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 139 days.

(21) Appl. No.: 15/842,111

(22) Filed: Dec. 14, 2017

(65) Prior Publication Data
US 2019/0118661 A1 Apr. 25, 2019

(30) Foreign Application Priority Data
Oct. 24, 2017 (KR) .......................... 10-2017-0138290

(51) Int. Cl.
| | | |
|---|---|---|
| *H02K 7/14* | (2006.01) | |
| *H02J 7/20* | (2006.01) | |
| *B60L 53/14* | (2019.01) | |
| *H02J 7/14* | (2006.01) | |
| *H01M 10/625* | (2014.01) | |
| *H05K 7/20* | (2006.01) | |
| *B60L 58/27* | (2019.01) | |
| *H01M 10/46* | (2006.01) | |

(Continued)

(52) U.S. Cl.
CPC ............... *B60L 53/14* (2019.02); *B60L 58/27* (2019.02); *H01M 10/46* (2013.01); *H01M 10/625* (2015.04); *H02J 7/007192* (2020.01); *H02J 7/1461* (2013.01); *H05K 7/20272* (2013.01); *B60L 2240/545* (2013.01); *B60Y 2200/91* (2013.01); *H01M 10/615* (2015.04); *H01M 10/6567* (2015.04)

(58) Field of Classification Search
CPC .... B60L 53/14; B60L 58/27; B60L 2240/545; H02J 7/1453; H02J 7/1461; H02J 7/0091; H05K 7/20272; H01M 10/615; H01M 10/625; H01M 10/6567; H01M 10/486; H01M 10/5004; B60Y 2200/91; Y02E 60/12; Y02T 10/7005
USPC ......................................................... 320/150
See application file for complete search history.

(56) References Cited

U.S. PATENT DOCUMENTS

| | | | | |
|---|---|---|---|---|
| 5,255,733 A | * | 10/1993 | King ...................... | B60H 1/004 165/299 |
| 5,670,860 A | * | 9/1997 | Conrady ............... | H02J 7/0042 320/109 |

(Continued)

*Primary Examiner* — Nathaniel R Pelton
*Assistant Examiner* — Mohammed J Sharief
(74) *Attorney, Agent, or Firm* — Mintz Levin Cohn Ferris Glovsky and Popeo, P.C.; Peter F. Corless (57) ABSTRACT

An electronic vehicle includes a power electronic component; a cooling water storage unit receiving cooling water capable of cooling the power electronic component; and a vehicle charging connection unit connected to an external cable at an external charger-side thereof and disposed on a path through which the cooling water is circulated. The circulating cooling water cools the vehicle charging connection unit.

5 Claims, 3 Drawing Sheets

(51) Int. Cl.
*H02J 7/00* (2006.01)
*H01M 10/6567* (2014.01)
*H01M 10/615* (2014.01)

(56) References Cited

U.S. PATENT DOCUMENTS

| | | | |
|---|---|---|---|
| 2013/0029193 A1* | 1/2013 | Dyer | H01M 10/486 |
| | | | 429/62 |
| 2014/0172216 A1* | 6/2014 | Seto | B60L 58/12 |
| | | | 701/22 |
| 2014/0297080 A1* | 10/2014 | Okamoto | B60W 10/30 |
| | | | 701/22 |
| 2016/0200206 A1* | 7/2016 | Woo | B60L 53/302 |
| | | | 320/109 |
| 2016/0221458 A1* | 8/2016 | Lopez | H05K 7/20927 |
| 2018/0198173 A1* | 7/2018 | Ichikawa | B60L 58/27 |
| 2019/0061543 A1* | 2/2019 | Jovet | F25B 25/00 |

* cited by examiner

ELECTRIC VEHICLE AND COOLING METHOD THEREOF

CROSS REFERENCE TO RELATED APPLICATION

This application claims the benefit of priority under 35 U.S.C. § 119 to Korea Application No. 10-2017-0138290 filed in the Korean Patent Office on Oct. 24, 2017, the entire disclosure of which is hereby incorporated by reference as if fully set forth herein.

BACKGROUND OF THE DISCLOSURE

Technical Field of the Disclosure

Embodiments of the present disclosure relate generally to vehicular technologies and, more particularly, to an electric vehicle and a cooling method thereof.

Discussion of the Related Art

A charger for supplying a high level of power, for example, 1000V/200 A or more, can shorten the charging time of a long-distance electric vehicle (BEV). In this way, when the output level of a charger greatly increases, a self-cooling system is often applied to an external cable of the charger-side to prevent damage due to heating under high output conditions. However, as a current of 200 A or more is applied for an extended period of time to a vehicle charging connection unit in an electric vehicle, which is connected to the external cable of the charger-side, excessive heat may be generated by the vehicle charging connection unit. Thus, there is a risk of the vehicle charging connection unit causing components of the vehicle, for example, an inlet or an internal cable of the vehicle, to catch fire due to the excessive heating.

SUMMARY OF THE DISCLOSURE

Accordingly, embodiments provide an electric vehicle and a cooling method thereof capable of stably charging high power, that substantially obviate one or more problems due to limitations and disadvantages of the related art.

According to embodiments of the present disclosure, an electronic vehicle includes: a power electronic component; a cooling water storage unit receiving cooling water capable of cooling the power electronic component; and a vehicle charging connection unit connected to an external cable at an external charger-side thereof and disposed on a path through which the cooling water is circulated. The circulating cooling water cools the vehicle charging connection unit.

The vehicle charging connection unit may include an inlet connected to at least one of the external cable and an internal cable.

The electric vehicle may further include a battery configured to be charged through the vehicle charging connection unit. A temperature of the battery or the power electronic component may be increased by the cooling water.

The electric vehicle may further include: a first sensing unit sensing a temperature of the power electronic component; a second sensing unit sensing the temperature of the vehicle charging connection unit; a third sensing unit sensing a temperature of the cooling water, wherein the cooling water increases the temperature of the battery; a first water pump circulating the cooling water to cool the power electronic component or the vehicle charging connection unit; a second water pump circulating the cooling water to cool the battery after increasing the temperature of the battery; a first valve disposed between the battery, the cooling water storage unit, and the first water pump, the first valve controlling a flow of the cooling water in response to a first control signal; a second valve disposed between the first valve, the cooling water storage unit, and the second water pump, the second valve controlling the flow of the cooling water in response to a second control signal; and a temperature control unit generating at least one of the first control signal and the second control signal in response to at least one of: a result sensed by the first sensing unit, a result sensed by the second sensing unit, a result sensed by the third sensing unit, and the temperature of the cooling water.

The vehicle charging connection unit may be disposed between the first water pump and the first valve.

The vehicle charging connection unit may be disposed between the power electronic component and the cooling water storage unit.

The electric vehicle may further include a cooling water temperature regulation unit regulating the temperature of the cooling water.

Furthermore, according to embodiments of the present disclosure, a cooling method performed in an electric vehicle, which includes a vehicle charging connection unit connected to an external cable at an external charger-side thereof, a battery configured to be charged through the vehicle charging connection unit, and a power electronic component cooled by cooling water for cooling the vehicle charging connection unit, includes: initiating a charging of the electric vehicle; sensing a temperature of the vehicle charging connection unit; and cooling the vehicle charging connection unit using the cooling water when the sensed temperature is greater than or equal to a first predetermined temperature.

The method may further include increasing a temperature of the battery using the cooling water when a temperature of the cooling water is greater than or equal to a second predetermined temperature after the charging of the electric vehicle is completed.

The second predetermined temperature may correspond to the temperature of the cooling water when the cooling water is heated to increase the temperature of the battery.

The method may further include increasing a temperature of the power electronic component using the cooling water when the temperature of the cooling water is greater than or equal to a second predetermined temperature after the charging of the electric vehicle is completed.

The second predetermined temperature may correspond to the temperature of the cooling water when the cooling water is heated to increase the temperature of the power electronic component.

BRIEF DESCRIPTION OF THE DRAWINGS

Arrangements and embodiments may be described in detail with reference to the following drawings in which like reference numerals refer to like elements and wherein.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE DISCLOSURE

The present disclosure will now be described more fully hereinafter with reference to the accompanying drawings, in which various embodiments are shown. The examples, however, be embodied in many different forms and should not be construed as being limited to the embodiments set forth herein. Rather, these embodiments are provided so that this disclosure will be more thorough and complete, and will more fully convey the scope of the disclosure to those skilled in the art.

The terminology used herein is for the purpose of describing particular embodiments only and is not intended to be limiting of the disclosure. In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

In addition, as used herein, relational terms, such as "first", "second", "on"/"upper"/"above", "under"/"lower"/"below," and the like, are used solely to distinguish one entity or element from another entity or element without necessarily requiring or implying any physical or logical relationship or order between such entities or elements.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g., fuels derived from resources other than petroleum). As referred to herein, a hybrid vehicle is a vehicle that has two or more sources of power, for example both gasoline-powered and electric-powered vehicles.

Additionally, it is understood that one or more of the below methods, or aspects thereof, may be executed by at least one control unit. The term "control unit" may refer to a hardware device that includes a memory and a processor. The memory is configured to store program instructions, and the processor is specifically programmed to execute the program instructions to perform one or more processes which are described further below. Moreover, it is understood that the below methods may be executed by an apparatus comprising the control unit in conjunction with one or more other components, as would be appreciated by a person of ordinary skill in the art.

Hereinafter, an electric vehicle 100 according to embodiments of the present disclosure will be described with reference to the accompanying drawings as follows.

Figure 1:
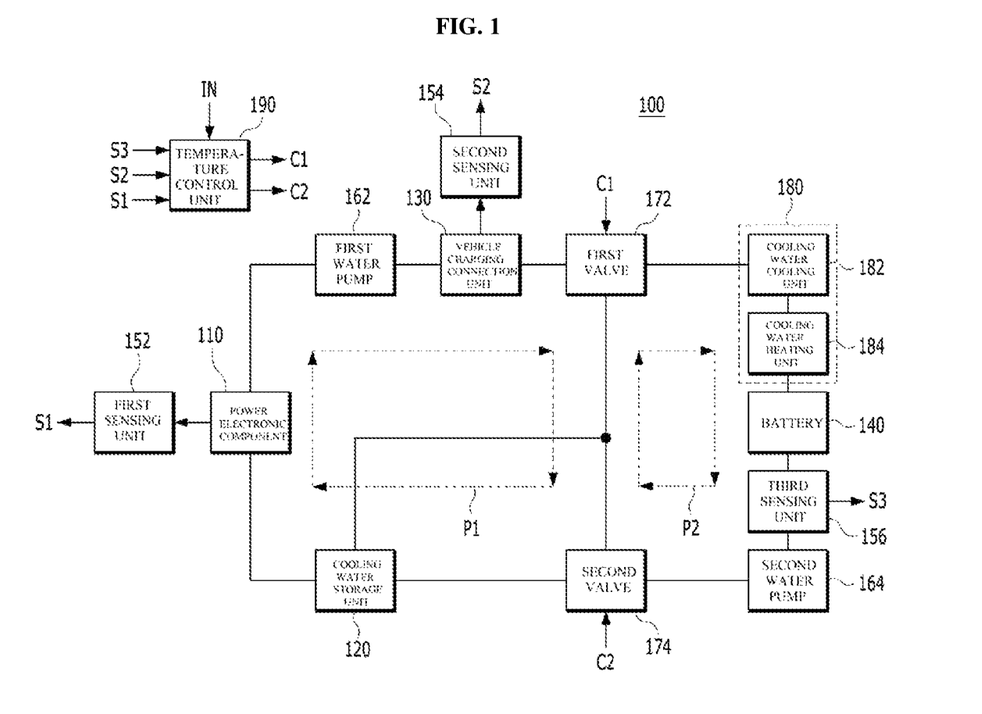
FIG. 1 shows a schematic block diagram of the electric vehicle according to embodiments of the present disclosure.

FIG. 1 shows a schematic block diagram of the electric vehicle 100 according to embodiments of the present disclosure. Here, the lines connecting the members 110, 120, 130, 140, 162, 164, 172, 174, and 180 may correspond to flow paths (or, pipes) through which the cooling water flows.

The electric vehicle 100 shown in FIG. 1 may include a power electronic (PE) component 110, a cooling water storage unit 120, a vehicle charging connection unit 130, a battery 140, first to third sensing units 152, 154, and 156, first and second water pumps 162 and 164, first and second valves 172 and 174, a cooling water temperature regulation unit 180, and a temperature control unit 190.

The power electronic (PE) component 110 may be cooled by cooling water. However, when the electric vehicle 100 is being charged, the cooling water may not be used to cool the power electronic component 110.

The power electronic component 110 may include an electronic device such as a motor or other general electronic component of the electric vehicle 100. For example, the power electronic component 110 may be an electric motor (not shown) or an inverter (not shown), but the embodiments are not limited to a specific configuration of the power electronic component 110.

The cooling water storage unit 120 may be a cooling water tank that receives the cooling water.

The vehicle charging connection unit 130 may be connected to an external cable of the external charger-side thereof (not shown) for receiving power to charge the battery 140. That is, the battery 140 may be charged through the vehicle charging connection unit 130. In this way, the vehicle charging connection unit 130 functions to interface the electric vehicle 100 with the external charger.

Hereinafter, an example of the vehicle charging connection unit 130 shown in FIG. 1 will be described with reference to FIG. 2 as follows, but the configuration of the vehicle charging connection unit 130 is not limited to FIG. 2.

Figure 2:
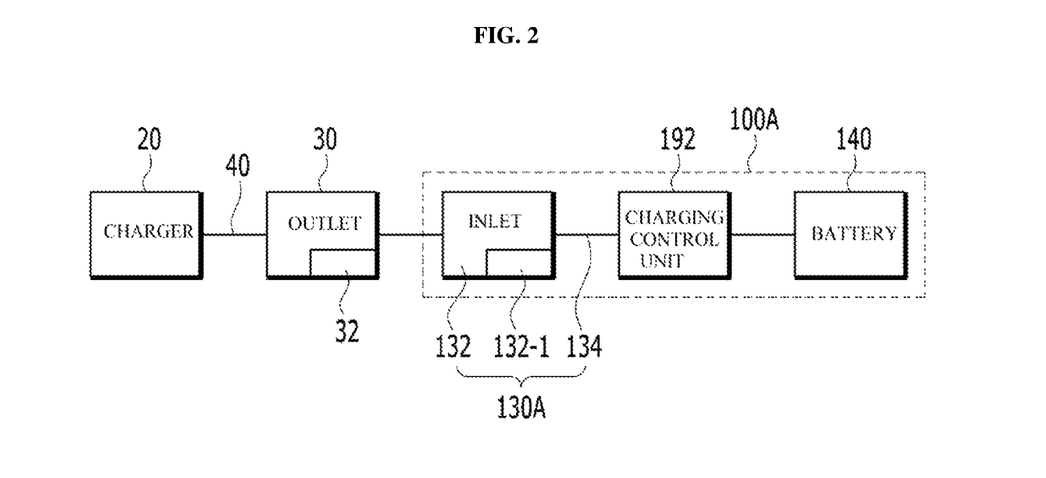
FIG. 2 shows a schematic block diagram of a vehicle charging system.

FIG. 2 shows a schematic block diagram of a vehicle charging system.

The electric vehicle 100A shown in FIG. 2 may correspond to the example of the electric vehicle 100 shown in FIG. 1 and may include a vehicle charging connection unit 130A, a battery 140, and a charging control unit 192. The battery 140 shown in FIG. 2 corresponds to the battery 140 shown in FIG. 1.

The charger 20 located outside the electric vehicle 100A may be a high-speed charger, a low-speed charger, or a low-speed charger for home use. The charger 20 may be connected to an outlet 30 through an external cable 40. That is, the outlet 30 may be disposed at the power output side of the external cable 40, and the outlet 30 may be connected to the electric vehicle 100A. Although each of the number of outlet 30 and the number of inlet 132 is one as shown in FIG. 2, embodiments of the present disclosure are not limited thereto. That is, in order to support all of the high-speed and low-speed charging by type of the charger 20, each of the number of outlet 30 and inlet 132 may be two. That is, the outlet 30 may include the high-speed outlet for fast charging and the low-speed outlet for slowly charging, and the inlet 132 may include an inlet for fast charging and an inlet for slowly charging. Hereinafter, for convenience of description, only one outlet 30 and one inlet 132 will be described below.

The vehicle charging connection unit 130A may include an inlet 132 and an internal cable 134.

The inlet 132 of the vehicle charging connection unit 130A may be connected to the outlet 30. When the outlet 30 is connected to the inlet 132 of the electric vehicle 100A, a path through which the electric power from the charger 20 is charged into the battery 140 may be formed.

The outlet 30 may also include a fixing portion 32 therein and the inlet 132 may include a locking portion 132-1 therein.

The locking portion 132-1 inside the inlet 132 may affect whether or not the electric vehicle 100A may be started. The fixing portion 32 of the outlet 30 serves to secure the outlet 30 to the inlet 132. When the locking portion 132-1 is in the locked state, the electric vehicle 100A may be started.

The charging control unit 192 may be a configuration that integrates a subject that controls the configuration in the vehicle charging system shown in FIG. 2, such as a battery management system (BMS), a vehicle control unit (VCU), and a motor control unit (MCU). Alternatively, the charging control unit 192 may be substantially divided into the battery management system for controlling charging/discharging of the battery 140 and/or SOC, etc., the vehicle control unit for controlling the entire vehicle, and the motor control unit for controlling the drive of the motor, but the embodiments of the present disclosure are not limited thereto.

The charging control unit 192 may receive from the inlet 132 a signal on whether the fixing portion 32 of the outlet 30 is fixed to the inlet 132 and may lock the locking portion 132-1 included in the inlet 132. In detail, the battery management system may lock the locking portion 132-1 of the inlet 132 by receiving from the inlet 132 a signal indicating that the fixing portion 32 of the outlet 30 is in a fixed state. That is, that the fixing portion 32 of the outlet 30 is in the fixed state means to charge the electric vehicle 100A at the outlet 30 side. If the charging control portion 192 recognizes this state, the locking portion 132-1 included in the inlet 132 of the electric vehicle 100A is locked so that the starting of the electric vehicle 100A in the state-of-charge may be prevented. When the locking portion 132-1 is in the locked state, the battery management system constituting the charging control unit 192 may charge the battery 140.

In case that the locking portion 132-1 is not actually locked even if the lock portion 132-1 is locked by the charging control portion 192, the battery management system may not receive the power required for charging the battery 140 from the charger 20, and may indicate through a display unit (not shown) including a cluster or a charge indicator that the locking portion 132-1 is not in a locked state. When the charging is completed or the charging is no longer requested, the fixing portion 32 of the outlet 30 is brought into the unlocked state, and the battery management system may release the locking of the locking portion 132-1 of the inlet 132 by receiving from the inlet 132 a signal indicating that the fixing portion 32 of the outlet 30 is in the release state. When the locking portion 132-1 becomes in the unlocked state, the charging control portion 192 controls the starting of the electric vehicle 100A to be possible.

The inner cable 134 is a part connected to the inlet 132, and may serve to connect the high-speed charger into the low-speed charger included in the interior of the electric vehicle 100A, although not shown.

Although the vehicle charging connection unit 130A includes the inlet 132 and the internal cable 134 as shown in FIG. 2, the embodiments of the present disclosure are not limited thereto. That is, the vehicle charging connection unit 130A shown in FIG. 2 is only one example for facilitating understanding of the vehicle charging connection unit 130 shown in FIG. 1, but the embodiments of the present disclosure are not limited to the specific configuration and operation of the vehicle charging connection unit 130.

When the high electric power having a high level, for example, 1000V/200 A or more, is supplied from the external charger 20 to the electric vehicle 100A in order to shorten the charging time of the battery 140, any member in the electric vehicle 100A that may be burned or damaged by a fire due to the overheating may correspond to the vehicle charging connection unit 130A.

Referring again to FIG. 1, the vehicle charging connection unit 130 may be disposed on the path through which the cooling water capable of cooling the power electronic component 110 is circulated and cooled by the cooling water. In order to cool the power electronic component 110, the cooling water is circulated along the first circulation path P1 formed in the direction indicated by the arrow shown in FIG. 1. However, while the electric vehicle 100 is being charged, the power electronic component 110 is not cooled. The cooling water that does not cool the power electronic component 110 during the charging of the electric vehicle 100 according to the embodiment may be used to cool the vehicle charging connection unit 130. To this end, the vehicle charging connection unit 130 may be disposed on the first circulation path P1.

According to one example, as illustrated in FIG. 1, the vehicle charging connection unit 130 may be disposed between the first water pump 162 and the first valve 172.

According to another example, unlike FIG. 1, the vehicle charging connection unit 130 may be disposed between the power electric component 110 and the cooling water storage unit 120.

However, as long as the vehicle charging connection unit 130 may be disposed on the first circulation path P1, the embodiments of the present disclosure are not limited to a specific location at which the vehicle charging connection unit 130 is disposed.

The first sensing unit 152 may sense the temperature of the power electronic component 110 and output the sensed result S1 (hereinafter, referred to as "first sensing temperature") to the temperature control unit 190.

The second sensing unit 154 may sense the temperature of the vehicle charging connection unit 154 and output the sensed result S2 (hereinafter, referred to as "second sensing temperature") to the temperature control unit 190.

According to one example, the third sensing unit 156 may sense the temperature of the cooling water that has increased the temperature of the battery 140 and output the sensed result S3 (hereinafter, referred to as "third sensing temperature") to the temperature control unit 190. To this end, the third sensing unit 156 is illustrated as being disposed between the battery 140 and the second water pump 164, but embodiments are not limited thereto.

According to another example, the third sensing unit 156 may sense the temperature of the cooling water to increase the temperature of the battery 140 and output the sensed result S3 to the temperature control unit 190. For this, the third sensing unit 156 may be disposed between the cooling water temperature regulation unit 180 and the battery 140, unlike FIG. 1

According to still another example, as each of the first sensing unit 152 and the second sensing unit 154 is are disposed outside the pipe instead of being disposed on the path of the pipe through which the cooling water flows, the third sensing unit 156 may be disposed outside the pipe instead of being disposed on the path of the pipe through which the cooling water flows. In this state, the third sensing unit 156 may sense the temperature of the battery 140 and output the sensed result S3 to the temperature control unit 190.

The first water pump 162 serves to circulate the cooling water. Generally, when the electric vehicle 100 is being charged, the power electronic component 110 is not cooled by the cooling water, so that the first water pump 162 does not operate. However, the first water pump 162 can be operated to circulate the cooling water while charging the battery 140 of the electric vehicle 100, whereby the vehicle charging connection unit 130 or the surroundings of the vehicle charging connection unit 130 may be cooled by the cooling water. For this purpose, for example, as illustrated in FIG. 1, the first water pump 162 may be disposed between the power electronic component 110 and the vehicle charging connection unit 130, but the embodiments are not limited thereto.

The second water pump 164 serves to circulate the cooling water. That is, the second water pump 164 circulates the cooling water along the second circulation path P2 formed in the direction indicated by the arrow, whereby the battery 140 may be cooled. To this end, the second water pump 164 may be disposed between the second valve 174 and the battery 140, but embodiments of the present disclosure are not limited thereto.

Although not shown, the temperature control unit 190 may further generate third and fourth control signals for controlling the first and second water pumps 162 and 164, respectively. In addition, the temperature control unit 190 may play the role of controlling the respective components shown in FIG. 1.

Each of the aforementioned first and second water pumps 162 and 164 may be an electric water pump (EWP), but the embodiments are not limited thereto.

Meanwhile, the first valve 172 may be disposed between the battery 140 and the cooling water storage unit 120 and the first water pump 162 and control the flow of the cooling water in response to the first control signal C1.

The second valve 174 may be disposed between the first valve 172 and the cooling water storage unit 120 and the second water pump 164 and control the flow of cooling water in response to the second control signal C2.

The temperature control unit 190 generates the first control signal C1 and provides the generated first control signal C1 to the first valve 172, to control the opening and closing of the flow path through the first valve 172 at the branch point of the flow path through which the cooling water flows. And, the temperature control unit 190 may generate the second control signal C2 and provides the generated second control signal C2 to the second valve 174 to control the opening and closing of the flow path through the second valve 174 at the branch point of the flow path through which the cooling water flows. To this end, each of the first and second valves 172 and 174 may be a 3-way open/close valve.

Meanwhile, the temperature control unit 190 may generate at least one of the first or second control signals C1 or C2 in respond to at least one of the first sensing temperature S1 sensed by the first sensing unit 152, the second sensing temperature S2 sensed by the second sensing unit 154, the third sensing temperature S3 sensed by the third sensing unit 156, or a temperature of the cooling water used for cooling the vehicle charging connection unit 130, and output the generated first and second control signals C1 and C2 to the first and second valves 172 and 174, respectively. For example, the temperature of the cooling water used for cooling the vehicle charging connection unit 130 may be provided to the temperature control unit 190 via the input terminal IN. Alternatively, when the cooling water used for cooling the vehicle charging connection unit 130 is provided through the input terminal IN, the temperature control unit 190 may measure the temperature of the cooling water.

According to embodiments of the present disclosure, in order to increase the temperature of at least one of the battery 140 or the power electronic component 110 by the cooling water used for cooling the vehicle charging connection unit 130, the temperature control unit 190 may control the opening/closing operation of at least one of the first or second valve 172 or 174.

Further, under the control of the temperature control unit 190, the cooling water temperature regulation unit 180 plays the role of regulating the temperature of the cooling water. As illustrated in FIG. 1, the cooling water temperature regulation unit 180 may be disposed between the first valve 172 and the battery 140, but embodiments of the present disclosure are not limited thereto.

For example, the cooling water temperature regulation unit 180 may include a cooling water cooling unit 182 and a cooling water heating unit 184.

The cooling water cooling unit 182 may be, for example, a battery chiller that serves to lower the temperature of the cooling water. The cooling water cooling unit 182 may be disposed between the first valve 172 and the battery 140 but the embodiments of the present disclosure are not limited to the specific location at which the cooling water cooling unit 182 is disposed. For example, when at least one of the power electronic component 110 or the battery 140 is overheated, the cooling water cooled in the cooling water cooling unit 182 is used to lower the temperature of at least one of the power electronic component 110 or the battery 140.

The cooling water heating unit 184 may heat the cooling water to have a desired temperature and provide the heated cooling water to the battery 140. For example, the cooling water heating unit 184 may be disposed between the cooling water cooling unit 182 and the battery 140, or may be disposed between the first valve 172 and the cooling water cooling unit 182, but the embodiments of the present disclosure are not limited to a specific location at which the cooling water heating unit 184 is disposed. Particularly, the cooling water heating unit 184 serves to increase the temperature of the cooling water to an appropriate temperature in an initial start state for starting the electric vehicle 100. Therefore, the temperature of the battery 140 may be increased to a temperature for normal operation by the cooling water having the increased temperature.

Hereinafter, a cooling method according to an embodiment performed in the electric vehicle according to embodiments of the present disclosure will be described with reference to FIG. 3 as follows. For the sake of the understanding, the cooling method according to the embodiment is described as being performed in the electric vehicle 100 shown in FIG. 1, but the embodiments are not limited thereto. That is, the cooling method 200 shown in FIG. 3 may be performed in another electric vehicle having a configuration different from the electric vehicle 100 shown in FIG. 1.

Figure 3:
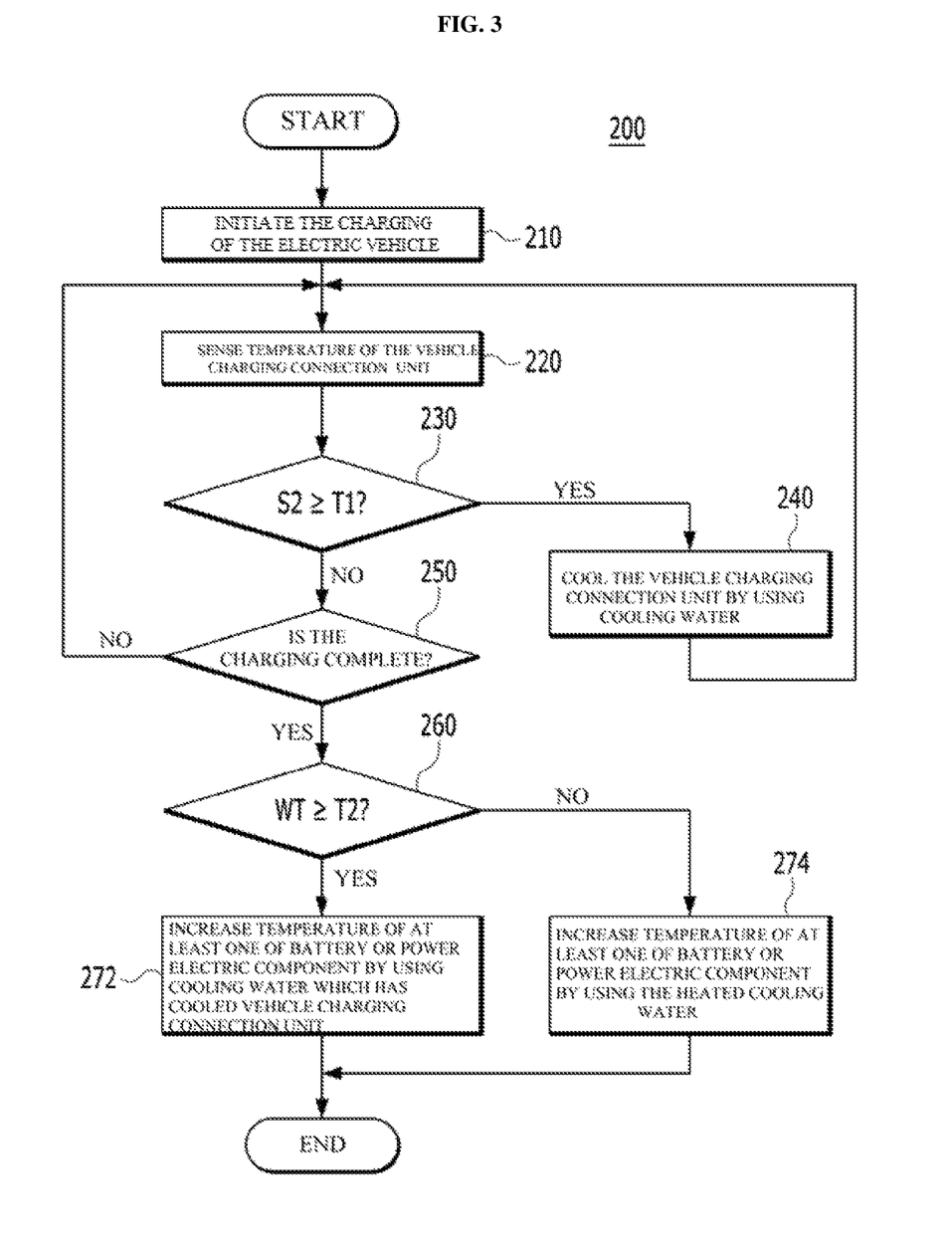
FIG. 3 is a flowchart for explaining an electric vehicle cooling method according to embodiments of the present disclosure.

FIG. 3 is a flowchart for explaining an electric vehicle cooling method 200 according to embodiments of the present disclosure.

First, the charging of the electric vehicle 100A is initiated (step 210). Referring to FIG. 2, for performing step 210, when the charger 20 is connected to the vehicle charging connection unit 130A via the external cable 40 and the outlet 30, the power may be charged to the battery 140 from the external charger 20. At this time, the power supplied from the external charger 20 may be a high electric power having a high level, for example, 100V/200 A or more. When such high electric power is supplied to the electric vehicle 100A, the electric vehicle 100A may be charged in a high speed.

After step 210, the second sensing unit 154 may sense the temperature of the vehicle charging connection unit 130 (step 220).

After step 220, it is determined whether the second sensing temperature S2 of the vehicle charging connection unit 130 sensed by the second sensing unit 154 may be equal to or greater than the first predetermined temperature T1 (step 230). Step 230 may be performed by the temperature control unit 190.

If the second sensing temperature S2 is equal to or greater than the first predetermined temperature T1, the vehicle cooling connection unit 130 is cooled using the cooling water (step 240). Here, the first predetermined temperature T1 may mean a temperature at which the vehicle charging connection unit 130 may be burned or damaged by a fire. That is, if the vehicle charging connection unit 130 is not cooled when the second sensing temperature S2 is greater than or equal to the first predetermined temperature T1, the vehicle charging connection unit 130 may be damaged by a fire or a fire may occur in the vehicle charging connection unit 130.

As described above, while the electric vehicle 100 charges the battery 140, the power electronic component 110 is not cooled by the cooling water. At this time, when the first water pump 162 circulates the cooling water along the first circulation path P1 formed in the direction of the arrow, the vehicle charging connection unit 130 located on the first circulation path P1 may be cooled by the cooling water. Thus, in order to perform step 240, the temperature control unit 190 may control the operation of at least one of the first water pump 162, the second water pump 164, the first valve 172, or the second valve 174 so that the cooling water may be circulated along the first circulation path P1. For example, when the vehicle drive signal IG3 is provided to the temperature control unit 190, the temperature control unit 190 may operate the corresponding member among the aforementioned members 162, 164, 172, and 174.

However, when the second sensing temperature S2 is smaller than the first predetermined temperature T1, it is determined whether the charging of the electric vehicle 100 is completed (step 250). Step 250 may be performed by the temperature control unit 190.

If the charging of the electric vehicle 100 is not completed, the process proceeds to step 220 where the second sensing unit 154 again senses the temperature of the vehicle charging connection unit 130.

However, if the charging of the electric vehicle 100 is completed, it is determined whether the temperature WT of the cooling water used for cooling the vehicle charging connection unit 130 in step 240 is greater than or equal to the second predetermined temperature T2 (step 260). Step 260 may be performed in the temperature control unit 190.

If the temperature WT of the cooling water used for cooling the vehicle charging connection unit 130 is greater than or equal to the second predetermined temperature T2, a temperature of the battery 140 may be increased using the cooling water used for cooling the vehicle charging connection unit 130 (Step 272). To this end, the temperature control unit 190 may control the opening and closing operation of the first valve 172 through the first control signal C1 so that the cooling water used for cooling the vehicle charging connection unit 130 may be supplied to the battery 140.

However, when the temperature WT of the cooling water used for cooling the vehicle charging connection unit 130 is less than the second predetermined temperature T2, the temperature of the battery 140 is increased using the cooling water heated by the cooling water heating unit 184 (Step 274). To this end, the temperature control unit 190 may control the first valve 172 and the cooling water temperature regulation unit 180 so that the heated cooling water may increase a temperature of the battery 140.

Here, the second predetermined temperature T2 may mean the temperature of the cooling water heated by the cooling water heating unit 184 to increase the temperature of the battery 140.

Alternatively, when the temperature WT of the cooling water used for cooling the vehicle charging connection unit 130 is equal to or greater than the predetermined temperature T2, the temperature of the power electric component 110 may be increased using the cooling water used for cooling the vehicle charging connection unit 130 (step 272). To this end, the temperature control unit 190 may control the operation of at least one of the first water pump 162, the second water pump 164, the first valve 172, or the second valve 174 so that the cooling water used for cooling the vehicle charging connection unit 130 is provided to the power electric component 110.

However, when the temperature WT of the cooling water used for cooling the vehicle charging connection unit 130 is smaller than the predetermined temperature T2, the temperature of the power electric component 110 may be increased using the cooling water heated by the cooling water heating unit 184 (step 274). To this end, the temperature control unit 190 may control at least one of the first water pump 162, the second water pump 164, the first valve 172, the second valve 174, or the cooling water temperature regulation unit 180 so that the heated cooling water may increase the temperature of the power electric component 110.

Here, the predetermined temperature T2 may correspond to the temperature of the cooling water heated by the cooling water heating unit 184 to increase the temperature of the power electric component 110.

Hereinafter, the effects of the electric vehicle 100 or 100A and the cooling method 200 performed in the vehicle 100 or 100A according to embodiments of the present disclosure will be described with reference to FIG. 4 as follows.

Figure 4:
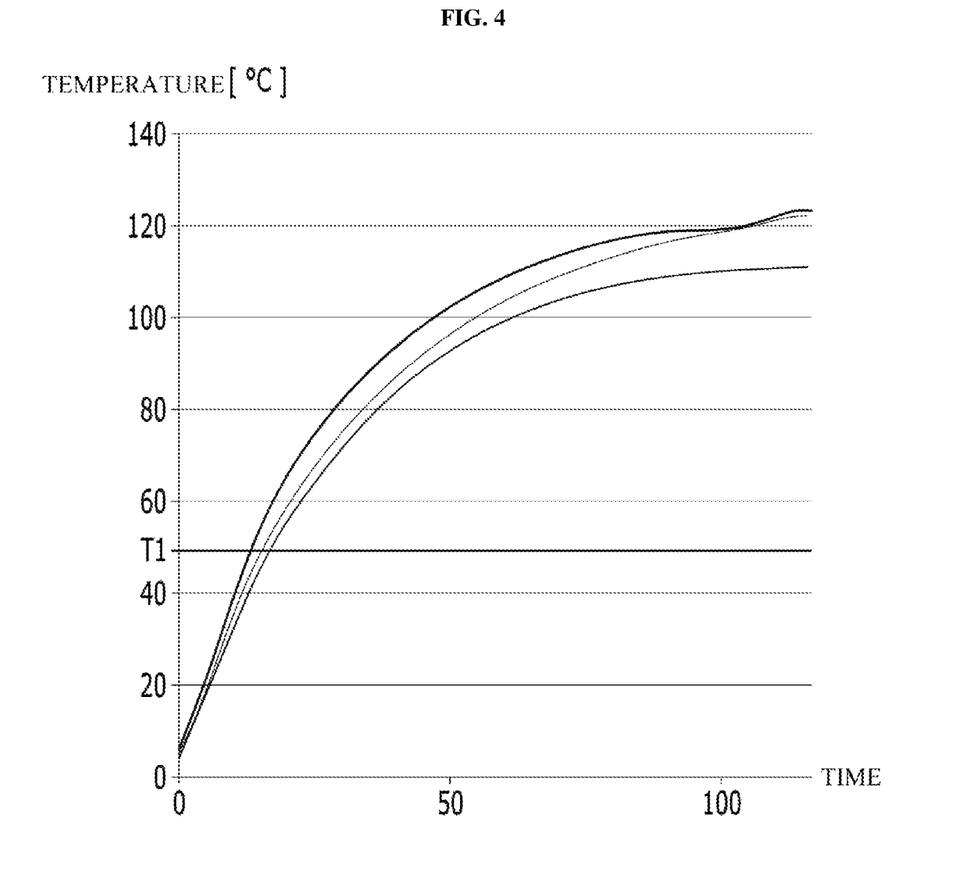
FIG. 4 is a graph showing a temperature change of the vehicle charging connection unit according to a comparative example.

FIG. 4 is a graph showing a temperature change of the vehicle charging connection unit 130 according to a comparative example, in which the horizontal axis represents time and the vertical axis represents temperature.

Conventionally, the vehicle charging connection unit 130 is not cooled. Therefore, as shown in FIG. 4, the temperature of the vehicle charging connection unit 130 continuously rises and overheats with the lapse of time for supplying electric power from the external charger 20 to the electric vehicle 100 or 100A so that the vehicle charging connection unit 130 may be damaged or burned by a fire. In this case, there is a problem that the cost is incurred and the replacement time is required for replacing the entire vehicle charging connection unit 130.

However, in case of the electric vehicle 100 and the cooling method 200 of the electric vehicle 100 according to embodiments of the present disclosure, when the second sensing temperature of the vehicle charging connection unit 130 is equal to or greater than the first predetermined temperature T1 with the lapse of time for supplying electric power from the external charger 20, the cooling water for cooling the power electronic component 110 is used to cool the vehicle charging connection unit 130, thereby lowering the temperature of the overheated vehicle charging connection unit 130 so that the vehicle charging connection unit 130 may be protected from high temperature. For example, as shown in FIG. 4, the first predetermined temperature T1 may be 50°, but the embodiments are not limited thereto. Therefore, it is possible to solve the problem that the vehicle charging connection unit 130 of the electric vehicle 100 according to the embodiment is damaged by a fire and the fire occurs in the vehicle charging connection unit 130, and the reliability and satisfaction of the user of the electric vehicle 100 may be increased.

Also, generally, in order for the power electronic component 110 or the battery 140 to perform a normal operation, the temperature of the power electronic component 110 or the battery 140 should be increased to a constant temperature. For example, when the power electronic component 110 or the battery 140 is placed in an extremely low temperature environment, it may take time to heat the cooling water to increase the temperature of the power electronic component 110 or the battery 140.

However, in the case of the electric vehicle 100 and the cooling method 200 of the electric vehicle 100 according to embodiments of the present disclosure, the temperature of at least one of the power electronic component 110 or the battery 140 may be increased after the charging of the vehicle is complete, by using the cooling water having a temperature that has already been increased to a predetermined temperature by cooling the vehicle charging connection unit 130, thereby more shortening a period of time required to increase the temperature of the power electronic component 110 or the battery 140 than in the conventional case. As a result, the charging efficiencies may be improved and the total charging time may be shortened so that the fuel efficiency of the electric vehicle 100 may be increased.

Also, in case of the electric vehicle 100 and the cooling method 200 of the electric vehicle 100 according to embodiments of the present disclosure, the vehicle charging connection unit 130 may be cooled during the charging of the electric vehicle 100 by using the cooling water used for cooling the power electronic component 110. Therefore, the electric vehicle 100 according to embodiments of the present disclosure does not require any additional hardware or equipment for cooling the vehicle charging connection unit 130 so that the cost may not be increased.

Although the present disclosure has been described with reference to certain illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electronic vehicle, comprising:
a power electronic component including at least one of an electric motor or an inverter;
a cooling water storage unit receiving cooling water;
a vehicle charging connection unit connected to an external cable at an external charger-side thereof to charge the electronic vehicle and disposed on a path through which the cooling water is circulated;
a battery configured to be charged through the vehicle charging connection unit;
a first sensing unit sensing a temperature of the power electronic component;
a second sensing unit sensing a temperature of the vehicle charging connection unit;
a third sensing unit sensing a temperature of the cooling water, wherein the cooling water has been used to increase the temperature of the battery;
a first water pump circulating the cooling water to cool the power electronic component or the vehicle charging connection unit;
a second water pump circulating the cooling water to cool the battery after increasing the temperature of the battery;
a first valve disposed between the battery, the cooling water storage unit, and the first water pump, the first valve controlling a flow of the cooling water in response to a first control signal;
a second valve disposed between the first valve, the cooling water storage unit, and the second water pump, the second valve controlling the flow of the cooling water in response to a second control signal; and
a temperature control unit generating at least one of the first control signal or the second control signal in response to at least one of: a result sensed by the first sensing unit, a result sensed by second sensing unit, a result sensed by the third sensing unit, or the temperature of the cooling water,
wherein the power electronic component is cooled by the cooling water circulated through the path, when the electric vehicle is not being charged,
wherein the circulating cooling water cools the vehicle charging connection unit during the charging of the electric vehicle, and
wherein a temperature of the battery or the power electronic component is increased by the circulated water coming through the circulation path after cooling the vehicle charging connection unit during the charging of the electric vehicle.

2. The electric vehicle according to claim 1, wherein the vehicle charging connection unit includes an inlet connected to at least one of the external cable or an internal cable.

3. The electric vehicle according to claim 1, wherein the vehicle charging connection unit is disposed between the first water pump and the first valve.

4. The electric vehicle according to claim 1, wherein the vehicle charging connection unit is disposed between the power electronic component and the cooling water storage unit.

5. The electric vehicle according to claim 1, further comprising a cooling water temperature regulation unit regulating the temperature of the cooling water.

* * * * *